(12) United States Patent
Wu et al.

(10) Patent No.: US 10,374,590 B2
(45) Date of Patent: Aug. 6, 2019

(54) AFC/TXAGC PDM INL

(71) Applicant: Intel Corporation, Santa Clara, CA (US)

(72) Inventors: Fanzhong Wu, Hangzhou (CN); Zhigang Li, Hangzhou (CN); Jie Yan, Hangzhou (CN)

(73) Assignee: Intel Corporation, Santa Clara, CA (US)

( * ) Notice: Subject to any disclaimer, the term of this patent is extended or adjusted under 35 U.S.C. 154(b) by 385 days.

(21) Appl. No.: 15/194,672

(22) Filed: Jun. 28, 2016

(65) Prior Publication Data
US 2017/0019088 A1 Jan. 19, 2017

(30) Foreign Application Priority Data
Jul. 17, 2015 (CN) .......................... 2015 1 0424522

(51) Int. Cl.
*H03K 7/08* (2006.01)
(52) U.S. Cl.
CPC ..................................... *H03K 7/08* (2013.01)
(58) Field of Classification Search
CPC combination set(s) only.
See application file for complete search history.

(56) References Cited

U.S. PATENT DOCUMENTS

| | | | | |
|---|---|---|---|---|
| 4,646,321 | A * | 2/1987 | Berlinsky | ............... H03K 7/08 332/109 |
| 5,892,404 | A * | 4/1999 | Tang | .................... H03F 1/0227 330/202 |
| 2002/0048318 | A1 * | 4/2002 | Zhang | .................... H03M 7/00 375/237 |

(Continued)

FOREIGN PATENT DOCUMENTS

| CN | 1123491 A | 5/1996 |
|---|---|---|
| CN | 1173077 A | 2/1998 |
| CN | 1493002 A | 4/2004 |

OTHER PUBLICATIONS

Office Action dated Jun. 28, 2017 for Chinese Patent Application No. 201510424522.9.

*Primary Examiner* — Junpeng Chen
(74) *Attorney, Agent, or Firm* — Schiff Hardin LLP

(57) ABSTRACT

Provided is a pulse density modulation value converter, comprising: a pulse density modulation reference point storage for storing a plurality of pulse density modulation reference points, each pulse density modulation reference point comprising a linear pulse density modulation value, an actual pulse density modulation value and/or an integral non-linear error value, wherein the integral non-linear error value is the difference between the actual pulse density modulation value and the linear pulse density modulation value; and a pulse density modulation value calculator for receiving a linear pulse density modulation value, searching the pulse density modulation reference point storage for a pair of pulse density modulation reference points closest to the linear pulse density modulation value, obtaining an actual pulse density modulation value corresponding to the linear pulse density modulation value through linear interpolation on the basis of the pair of pulse density modulation reference points, and outputting the actual pulse density modulation value.

16 Claims, 3 Drawing Sheets

(56) References Cited

U.S. PATENT DOCUMENTS

2004/0090264 A1    5/2004   Nilsson et al.
2016/0134295 A1*   5/2016   Kris ..................... G06F 1/022
                                                    341/144

* cited by examiner

AFC/TXAGC PDM INL

FIELD OF THE INVENTION

The present invention relates to a pulse density modulation (PDM) value converter and an application thereof, and more particularly to a PDM modulation value converter; an automatic gain controller (AGC) using PDM, an automatic frequency controller (AFC) using PDM and a mobile terminal using PDM, and a method thereof.

BACKGROUND ART

As a technology of signal control, pulse density modulation (PDM) is widely applied in electronic circuits, such as communication devices, power control devices, and tuning units. Particularly, PDM can be used in an automatic gain controller (AGC) and/or an automatic frequency controller (AFC) in mobile terminals for transmission power control and tuning control respectively.

For example, when using PDM for automatic gain control, in order to control a transmission power to a target power value, a corresponding PDM value needs to be set. In practice, only the PDM values of several points calibrated in advance are generally stored. As the target power value is not necessarily on these points, a corresponding PDM value needs to be calculated through linear interpolation.

However, the relationship between the PDM value of an actual chip and the corresponding power value is not an ideal linear one. That is, an integral non-linear (INL) error exists. Therefore, when automatic gain control is conducted using a PDM value calculated through linear interpolation, an error of the actual power value is caused by the INL error, thus leading to a relatively long ping-pong time, that is, it requires a plurality of adjustments for the PDM value to finally reach the target power value.

For automatic frequency control, a similar problem also exists that an error of an actual frequency value is caused when using PDM tuning and that it requires a plurality of adjustments for PDM before reaching a target frequency value. The above-mentioned problems caused by INL errors are not limited to AGC and AFC, but will affect any circuits using a PDM value.

SUMMARY OF THE INVENTION

Therefore, in order to solve the above-mentioned problems, the present invention provides a pulse density modulation (PDM) value converter; an automatic gain controller (AGC) using PDM, an automatic frequency controller (AFC) using PDM and a mobile terminal using PDM, and a method thereof, wherein the linearity of a PDM value is improved by correcting an integral non-linear (INL) error.

According to one embodiment of the present invention, provided is a pulse density modulation (PDM) value converter comprising: a PDM reference point storage to store a plurality of PDM reference points, each PDM reference point comprising a linear PDM value, an actual PDM value and/or an integral non-linear (INL) error value, wherein the INL error value is the difference between the actual PDM value and the linear PDM value; and a PDM value calculator to receive a linear PDM value, look up a pair of PDM reference points closest to the linear PDM value in the PDM reference point memory, obtain an actual PDM value corresponding to the linear PDM value through linear interpolation based on the pair of PDM reference points, and output the actual PDM value.

According to an embodiment, the PDM value calculator may linearly interpolate the PDM values of the pair of PDM reference points to obtain an actual PDM value corresponding to the linear PDM value.

According to an embodiment, the PDM value calculator may linearly interpolate the INL error values of the pair of PDM reference points to obtain an INL error value corresponding to the linear PDM value, and obtain an actual PDM value corresponding to the linear PDM value based on the linear PDM value and the INL error value.

According to another embodiment of the present invention, provided is a method of pulse density modulation (PDM) value conversion, the method comprising: receiving a linear PDM value; looking up a pair of PDM reference points closest to the linear PDM value among a plurality of PDM reference points, wherein each PDM reference point comprises a linear PDM value, an actual PDM value and/or an integral non-linear (INL) error value, the INL error value being the difference between the actual PDM value and the linear PDM value; obtaining an actual PDM value corresponding to the linear PDM value through linear interpolation based on the pair of PDM reference points; and outputting the actual PDM value.

According to an embodiment, obtaining an actual PDM value corresponding to the linear PDM value through linear interpolation may comprise: linearly interpolating the PDM values of the pair of PDM reference points to obtain an actual PDM value corresponding to the linear PDM value.

According to an embodiment, obtaining an actual PDM value corresponding to the linear PDM value through linear interpolation may comprise: linearly the INL error values of the pair of PDM reference points to obtain an INL error value corresponding to the linear PDM value; and obtaining an actual PDM value corresponding to the linear PDM value based on the linear PDM value and the INL error value.

According to another embodiment of the present invention, provided is an automatic gain controller comprising: a power reference point memory to store a plurality of power reference points, each power reference point comprising a power value and a linear pulse density modulation (PDM) value; a PDM value converter to convert a linear PDM value into an actual PDM value; a power PDM value calculator to receive a target power value, look up a pair of power reference points closest to the target power value in the power reference point memory, linearly interpolating the linear PDM values of the pair of power reference points to obtain a linear power PDM value corresponding to the target power value, and convert the linear power PDM value into an actual power PDM value via the PDM value converter; and a PDM modulator to perform automatic gain control based on the actual power PDM value.

According to an embodiment, the PDM value converter may comprise: a PDM reference point memory to store a plurality of PDM reference points, each PDM reference point comprising a linear PDM value, an actual PDM value and/or an integral non-linear (INL) error value, wherein the INL error value is the difference between the actual PDM value and the linear PDM value; and a PDM value calculator to receive a linear PDM value, look up a pair of PDM reference points closest to the linear PDM value in the PDM reference point memory, obtain an actual PDM value corresponding to the linear PDM value through linear interpolation based on the pair of PDM reference points, and output the actual PDM value.

According to an embodiment, the PDM value calculator may linearly interpolate the PDM values of the pair of PDM reference points to obtain an actual PDM value corresponding to the linear PDM value.

According to an embodiment, the PDM value calculator may linearly interpolate the INL error values of the pair of PDM reference points to obtain an INL error value corresponding to the linear PDM value, and obtain an actual PDM value corresponding to the linear PDM value based on the linear PDM value and the INL error value.

According to another embodiment of the present invention, provided is a method of automatic gain control, the method comprising: receiving a target power value; looking up a pair of power reference points closest to the target power value among a plurality of power reference points, wherein each power reference point comprises a power value and a linear pulse density modulation (PDM) value; linearly interpolating the linear PDM values of the pair of power reference points to obtain a linear power PDM value corresponding to the target power value; converting the linear power PDM value into an actual power PDM value; and performing automatic gain control based on the actual power PDM value.

According to an embodiment, converting the linear power PDM value into an actual power PDM value may comprise: looking up a pair of PDM reference points closest to the linear power PDM value among a plurality of PDM reference points, wherein each PDM reference point comprises a linear PDM value, an actual PDM value and/or an integral non-linear (INL) error value, the INL error value being the difference between the actual PDM value and the linear PDM value; and obtaining an actual power PDM value corresponding to the linear power PDM value through linear interpolation based on the pair of PDM reference points.

According to an embodiment, obtaining an actual power PDM value corresponding to the linear power PDM value through linear interpolation may comprise: linearly interpolating the PDM values of the pair of PDM reference points to obtain an actual power PDM value corresponding to the linear power PDM value.

According to an embodiments, obtaining an actual power PDM value corresponding to the linear power PDM value through interpolation may comprise: linearly interpolating the INL error values of the pair of PDM reference points to obtain an INL error value corresponding to the linear power PDM value; and obtaining an actual power PDM value corresponding to the linear power PDM value based on the linear power PDM value and the INL error value.

According to another embodiment of the present invention, provided is an automatic frequency controller comprising: a frequency reference point memory to store a plurality of frequency reference points, each frequency reference point comprising a frequency value and a linear pulse density modulation (PDM) value; a PDM value converter to convert a linear PDM value into an actual PDM value; a frequency PDM value calculator to receive a target frequency value, look up a pair of frequency reference points closest to the target frequency value in the frequency reference point memory, linearly interpolate the linear PDM values of the pair of frequency reference points to obtain a linear frequency PDM value corresponding to the target frequency value, and convert the linear frequency PDM value into an actual frequency PDM value via the PDM value converter; and a PDM modulator to perform automatic frequency control based on the actual frequency PDM value.

According to an embodiment, the PDM value converter may comprise: a PDM reference point memory to store a plurality of PDM reference points, each PDM reference point comprising a linear PDM value, an actual PDM value and/or an integral non-linear (INL) error value, wherein the INL error value is the difference between the actual PDM value and the linear PDM value; and a PDM value calculator to receive a linear PDM value, look up a pair of PDM reference points closest to the linear PDM value in the PDM reference point memory, obtain an actual PDM value corresponding to the linear PDM value through linear interpolation based on the pair of PDM reference points, and output the actual PDM value.

According to an embodiment, the PDM value calculator may linearly interpolating the PDM values of the pair of PDM reference points to obtain an actual PDM value corresponding to the linear PDM value.

According to an embodiment, the PDM value calculator may linearly interpolate the INL error values of the pair of PDM reference points to obtain an INL error value corresponding to the linear PDM value, and obtain an actual PDM value corresponding to the linear PDM value based on the linear PDM value and the INL error value.

According to another embodiment of the present invention, provided is a method of automatic frequency control, the method comprising: receiving a target frequency value; looking up a pair of frequency reference points closest to the target frequency value among a plurality of frequency reference points, wherein each frequency reference point comprises a frequency value and a linear pulse density modulation (PDM) value; linearly interpolating the linear PDM values of the pair of frequency reference points to obtain a linear frequency PDM value corresponding to the target frequency value; converting the linear frequency PDM value into an actual frequency PDM value; and performing automatic frequency control based on the actual frequency PDM value.

According to an embodiment, converting the linear frequency PDM value into an actual frequency PDM value may comprise: looking up a pair of PDM reference points closest to the linear frequency PDM value among a plurality of PDM reference points, wherein each PDM reference point comprises a linear PDM value, an actual PDM value and/or an integral non-linear (INL) error value, the INL error value being the difference between the actual PDM value and the linear PDM value; and obtaining an actual frequency PDM value corresponding to the linear frequency PDM value through linear interpolation based on the pair of PDM reference points.

According to an embodiment, obtaining an actual frequency PDM value corresponding to the linear frequency PDM value through linear interpolation may comprise: linearly interpolating the PDM values of the pair of PDM reference points to obtain an actual frequency PDM value corresponding to the linear frequency PDM value.

According to an embodiment, obtaining an actual frequency PDM value corresponding to the linear frequency PDM value through linear interpolation may comprise: linearly interpolating the INL error values of the pair of PDM reference points to obtain an INL error value corresponding to the linear frequency PDM value; and obtaining an actual frequency PDM value corresponding to the linear frequency PDM value based on the linear frequency PDM value and the INL error value.

According to another embodiment of the present invention, provided is a mobile terminal comprising an automatic gain controller according to embodiments of the present invention.

According to another embodiment of the present invention, provided is a mobile terminal comprising an automatic frequency controller according to embodiments of the present invention.

According to another embodiment of the present invention, provided is a mobile terminal comprising a PDM value converter according to embodiments of the present invention.

DETAILED DESCRIPTION OF THE INVENTION

Figure 1:
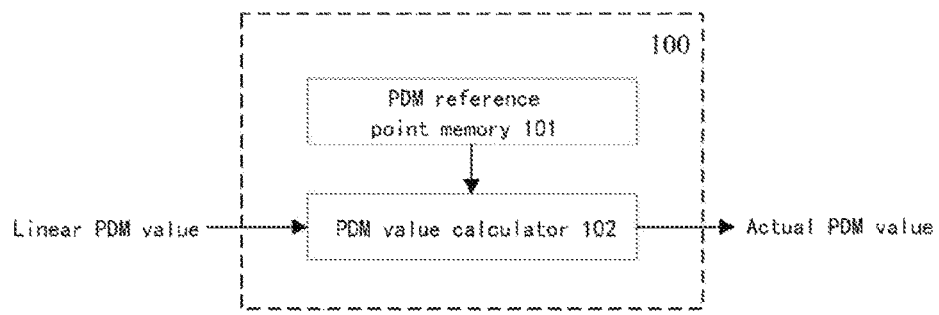
FIG. 1 shows a block diagram of a pulse density modulation (PDM) value converter according to an embodiment of the present invention.

Exemplary embodiments according to the present invention are described in detail below with reference to the accompanying drawings. Throughout the drawings, identical or like reference numerals are granted to components which are substantially structurally and functionally the same, and redundant description on the substantially same components is omitted for conciseness of the description.

According to the present invention, in order to improve the accuracy of linear interpolation of a pulse density modulation (PDM) value, the linearity of the PDM value needs to be improved, namely, the integral non-linear (INL) error therein is to be eliminated. Here, an INL error eliminated PDM value is referred to as a linear PDM value, and an uncorrected PDM value is referred to as an actual PDM value.

In order to realize the conversion between a linear PDM value and an actual PDM in practical use, the INL errors on several PDM reference points need to be pre-determined. This process can be conducted before chips leave the factory.

As the INL errors of the PDM values of chips may be relatively consistent among the same batch, and may be significantly different among different batches, PDM value correction information may generally be produced individually for each batch of chips. For example, sample chips can be extracted from the same batch of chips, and INL tests for PDM values are respectively conducted to obtain INL error values, and the INL error values are averaged to obtain an INL error value of this batch of chips.

Examples of PDM reference points obtained after sample chip INL tests and averaging are shown in table 1 below.

TABLE 1

| Serial number | Linear PDM value | Actual PDM value | INL error value |
|---|---|---|---|
| 0 | 28 | 0 | −28 |
| 1 | 128 | 104 | −24 |
| 2 | 256 | 236 | −20 |
| 3 | 384 | 368 | −16 |
| 4 | 512 | 500 | −12 |
| 5 | 640 | 633 | −7 |
| 6 | 768 | 764 | −4 |
| 7 | 896 | 896 | 0 |
| 8 | 1024 | 1027 | 3 |
| 9 | 1152 | 1158 | 6 |
| 10 | 1280 | 1288 | 8 |
| 11 | 1408 | 1419 | 11 |
| 12 | 1536 | 1549 | 13 |
| 13 | 1664 | 1680 | 16 |
| 14 | 1792 | 1810 | 18 |
| 15 | 1920 | 1939 | 19 |
| 16 | 2048 | 2068 | 20 |
| 17 | 2176 | 2192 | 16 |
| 18 | 2304 | 2316 | 12 |
| 19 | 2432 | 2441 | 9 |
| 20 | 2560 | 2567 | 7 |
| 21 | 2688 | 2692 | 4 |
| 22 | 2816 | 2818 | 2 |
| 23 | 2944 | 2943 | −1 |
| 24 | 3072 | 3069 | −3 |
| 25 | 3200 | 3195 | −5 |
| 26 | 3328 | 3321 | −7 |
| 27 | 3456 | 3447 | −9 |
| 28 | 3584 | 3575 | −9 |
| 29 | 3712 | 3701 | −11 |
| 30 | 3840 | 3829 | −11 |
| 31 | 3968 | 3956 | −12 |
| 32 | 4095 | 4083 | −12 |

In table 1, each row corresponds to one PDM reference point. The PDM reference points in table 1 comprise a linear PDM value, an actual PDM value and an INL error value, wherein the INL error value is the difference between the actual PDM value and the linear PDM value. However, this is merely an example, and the present invention is not limited in this regard. According to an embodiment, the PDM reference points may also be in another form, for example, may comprise only two of the linear PDM value, the actual PDM value and the INL error value, or the like.

FIG. 1 shows a block diagram of a pulse density modulation (PDM) value converter 100 according to an embodiment of the present invention.

Referring to FIG. 1, the PDM value converter 100 comprises a PDM reference point memory 101 and a PDM value calculator 102. The PDM reference points obtained through the tests before chips leave the factory can be pre-stored in the PDM reference point memory 101, for example, as shown in table 1 above.

The PDM value calculator 102 receives a linear PDM modulation value, and looks up a pair of PDM reference points closest to the linear PDM modulation value in the PDM reference point memory 101. On the basis of the pair of PDM reference points, the PDM value calculator 102 obtains an actual PDM value corresponding to the PDM modulation value through linear interpolation and outputs the actual PDM value.

Particularly, when a PDM reference point comprises a linear PDM value and a corresponding actual PDM value, the PDM value calculator 102 may linearly interpolate the actual PDM values of the pair of pulse density modulation reference points to obtain an actual PDM value corresponding to the linear PDM value directly.

Alternatively, when a PDM reference point comprises a linear PDM value and a corresponding INL error value, the PDM value calculator 102 may linearly interpolate the INL error values of the pair of PDM reference points to obtain an INL error value corresponding to the linear PDM value, and obtain an actual PDM value corresponding to the linear PDM value based on the linear PDM value and the INL error value.

Although the PDM value converter 100 of FIG. 1 receives a linear PDM modulation value and converts it into a corresponding actual PDM value, the present invention is not limited in this regard. According to an embodiment, an actual PDM modulation value may also be received and converted into a corresponding linear PDM value; the operation method thereof is similar and will not be further described.

Figure 2:
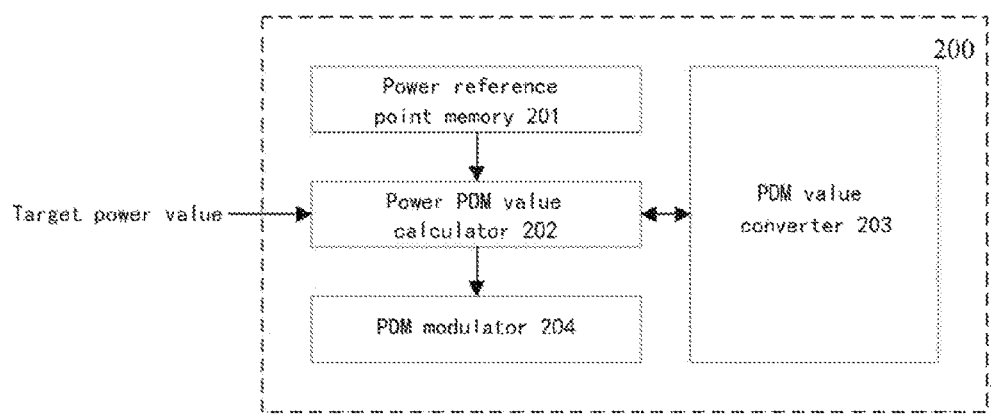
FIG. 2 shows a block diagram of an automatic gain controller according to an embodiment of the present invention.

FIG. 2 shows a block diagram of an automatic gain controller 200 according to an embodiment of the present invention.

Referring to FIG. 2, the automatic gain controller 200 comprises a power reference point memory 201, a power PDM value calculator 202, a PDM value converter 203 and a PDM modulator 204.

A plurality of power reference points can be pre-stored in the power reference point memory 201, with each power reference point comprising a power value and a corresponding linear PDM value. Generally, power reference points are pre-produced through calibration and stored during production.

Examples of power reference points pre-stored in the power reference point memory 201 are shown in table 2 below, in which the linear PDM value can be obtained by correcting the actual PDM value based on the INL error value.

TABLE 2

| Power value | Linear PDM value |
|---|---|
| 4.08412 | 2772 |
| 9.962472 | 2922 |
| 14.92162 | 3049 |
| 17.74155 | 3121 |

Although a power reference point stored in the power reference point memory 201 of FIG. 2 comprises a power value and a corresponding linear PDM value, the present invention is not limited in this regard. According to an embodiment, a power reference point may also comprise a power value and a corresponding actual PDM value.

The power PDM value calculator 202 receives a target power value, looks up a pair of power reference points closest to the target power value in the power reference point memory 201, linearly interpolates the linear PDM values of the pair of power reference points to obtain a linear power PDM value corresponding to the target power value, and converts the linear power PDM value into an actual power PDM value via the PDM value converter 203.

Alternatively, when a power reference point comprises a power value and a corresponding actual PDM value, the power PDM value calculator 202 may convert an actual PDM value in a power reference point into a corresponding linear PDM value via the PDM value converter 203 for linear interpolation.

The PDM value converter 203 may be the PDM value converter 100 of FIG. 1 for conversion between a linear PDM value and an actual PDM value.

The PDM modulator 204 performs automatic gain control based on the actual power PDM value produced by the power PDM value calculator 202.

As the power PDM value calculator 202 uses an INL error corrected linear PDM value in the linear interpolation calculation, a more accurate actual power PDM value may finally be produced for power control. Thus, the reciprocating ping-pong time can be reduced, accelerating the automatic gain control.

Figure 3:
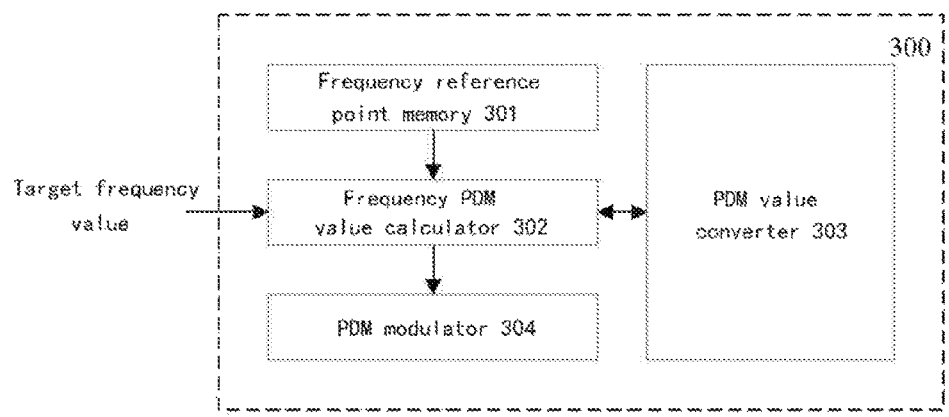
FIG. 3 shows a block diagram of an automatic frequency controller according to an embodiment of the present invention.

FIG. 3 shows a block diagram of an automatic frequency controller 300 according to an embodiment of the present invention.

Referring to FIG. 3, the automatic frequency controller 300 comprises a frequency reference point memory 301, a frequency PDM value calculator 302, a PDM value converter 303 and a PDM modulator 304.

A plurality of frequency reference points can be pre-stored in the frequency reference point memory 301, with each frequency reference point comprising a frequency value and a corresponding linear PDM value. Generally, frequency reference points are pre-produced through calibration and stored during production.

Although a frequency reference point stored in the frequency reference point memory 301 of FIG. 3 comprises a frequency value and a corresponding linear PDM value, the present invention is not limited in this regard. According to an embodiment, a frequency reference point may also comprise a frequency value and a corresponding actual PDM value.

The frequency PDM value calculator 302 receives a target frequency value, looks up a pair of frequency reference points closest to the target frequency value, linearly interpolates the linear PDM values of the pair of frequency reference points to obtain a linear frequency PDM value corresponding to the target frequency value, and converts the linear frequency PDM value into an actual frequency PDM value via the PDM value converter 303.

Alternatively, when a frequency reference point comprises a frequency value and a corresponding actual PDM value, the frequency PDM value calculator 202 may convert a actual PDM value in a frequency reference point into a corresponding linear PDM value via the PDM value converter 203 for linear interpolation.

The PDM value converter 303 may be the PDM value converter 100 of FIG. 1 for conversion between a linear PDM value and an actual PDM value.

The PDM modulator 304 performs the automatic gain control based on the actual frequency PDM value produced by the frequency PDM value calculator 302.

As the frequency PDM value calculator 302 uses an INL error corrected linear PDM value in the linear interpolation calculation, a more accurate actual frequency PDM value can finally be produced for tuning control. Thus, the reciprocating ping-pong time can be reduced, accelerating the automatic frequency control.

Figure 4:
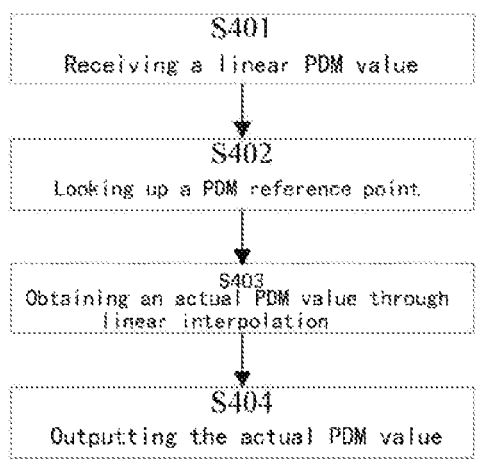
FIG. 4 shows a flowchart of a method of PDM value conversion according to an embodiment of the present invention.

FIG. 4 shows a flowchart of a method of PDM value conversion according to an embodiment of the present invention.

Referring to FIG. 4, at step S401, a linear PDM value is received.

At step S402, a pair of PDM reference points closest to the linear PDM value are looked up among a plurality of pre-stored PDM reference points, wherein each PDM reference point comprises a linear PDM value, an actual PDM value and/or an integral non-linear (INL) error value, the INL error value being the difference between the actual PDM value and the linear PDM value. The plurality of pre-stored PDM reference points mentioned above can be obtained through tests before chips leave the factory, for example, as shown in table 2 above.

At step S403, an actual PDM value corresponding to the linear PDM value is obtained through linear interpolation based on the pair of PDM reference points found.

Particularly, when a PDM reference point comprises a linear PDM value and a corresponding actual PDM value, the actual PDM values of the pair of pulse density modulation reference points can be linearly interpolated to obtain an actual PDM value corresponding to the linear PDM value directly.

Alternatively, when a PDM reference point comprises a linear PDM value and a corresponding INL error value, the INL error values of the pair of PDM reference point can be linearly interpolated to obtain an INL error value corresponding to the linear PDM value, and an actual PDM value corresponding to the linear PDM value can be obtained based on the linear PDM value and the INL error value.

At step S404, the actual PDM value is output.

Although in the method of PDM value conversion of FIG. 3 a linear PDM modulation value is received and converted into a corresponding actual PDM value, the present invention is not limited in this regard. According to an embodiment, an actual PDM modulation value can also be received and converted into a corresponding linear PDM value; the operation method thereof is similar and will not be further described.

Figure 5:
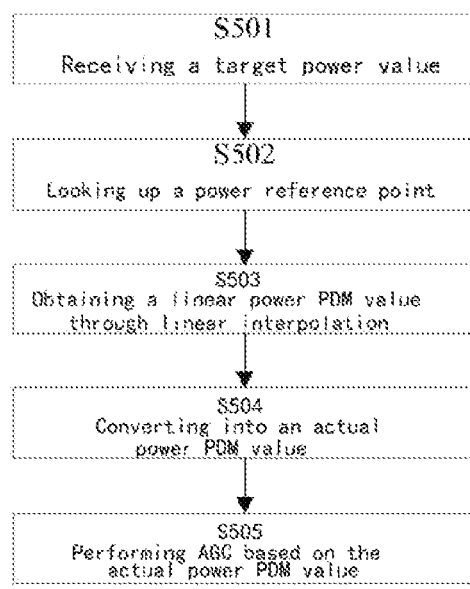
FIG. 5 shows a flowchart of a method of automatic gain control according to an embodiment of the present invention.

FIG. 5 shows a flowchart of a method of automatic gain control according to an embodiment of the present invention.

Referring to FIG. 5, at step S501, a target power value is received.

At step S502, a pair of power reference points closest to the target power value are looked up among a plurality of power reference points, wherein each power reference point comprises a power value and a linear PDM value. Generally, a power reference point is pre-produced through calibration and stored during production, for example, as shown in table 2.

As an example, a pre-stored power reference point may comprise a power value and a corresponding linear PDM value, but the present invention is not limited in this regard. According to an embodiment, a power reference point may also comprise a power value and a corresponding actual PDM value.

At step S503, the linear PDM values of the pair of power reference points are linearly interpolated to obtain a linear PDM modulation value corresponding to the target power value.

Alternatively, when a power reference point comprises a power value and a corresponding actual PDM value, the actual PDM value of the power reference point can be converted into a corresponding linear PDM value for linear interpolation.

At step S504, the linear power PDM value is converted into an actual power PDM value.

The process of conversion between a linear PDM value and an actual PDM value can be carried out with reference to steps S401 to S404.

At step S505, automatic gain control is performed based on the actual power PDM value.

As an INL error corrected linear PDM value is used in the linear interpolation calculation, a more accurate actual power PDM value can thus finally be produced for power control. Thus, the reciprocating ping-pong time can be reduced, accelerating the automatic gain control.

Figure 6:
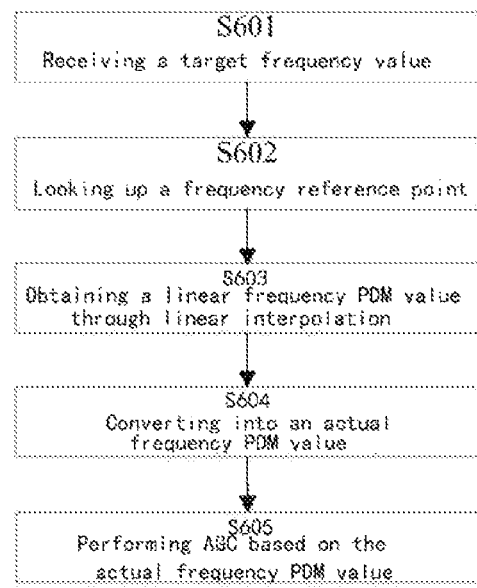
FIG. 6 shows a flowchart of a method of automatic frequency control according to an embodiment of the present invention.

FIG. 6 shows a flowchart of a method of automatic frequency control according to an embodiment of the present invention.

Referring to FIG. 6, at step S601, a target frequency value is received.

At step S602, a pair of frequency reference points closest to the target frequency value are looked up among a plurality of pre-stored frequency reference points, wherein each frequency reference point comprises a frequency value and a linear PDM value. Generally, a frequency reference point is pre-produced through calibration and stored during production.

As an example, a pre-stored frequency reference point may comprise a frequency value and a corresponding linear PDM value, but the present invention is not limited in this regard. According to an embodiment, a frequency reference point may also comprise a frequency value and a corresponding actual PDM value.

At step S603, the linear PDM values of the pair of frequency reference points are linearly interpolated to obtain a linear PDM modulation value corresponding to the target frequency value.

Alternatively, when a frequency reference point comprises a frequency value and a corresponding actual PDM value, the actual PDM value of the frequency reference point may be converted into a corresponding linear PDM value for linear interpolation.

At step S604, the linear frequency PDM value is converted into an actual frequency PDM value.

The process of conversion between a linear PDM value and an actual PDM value can be carried out with reference to steps S401 to S404.

At step S605, automatic frequency control is performed based on the actual frequency PDM value.

As an INL error corrected linear PDM value is used in the linear interpolation calculation, a more accurate actual frequency PDM value can thus finally be produced for tuning control. Thus, the reciprocating ping-pong time can be reduced, accelerating the automatic frequency control.

Figure 7:
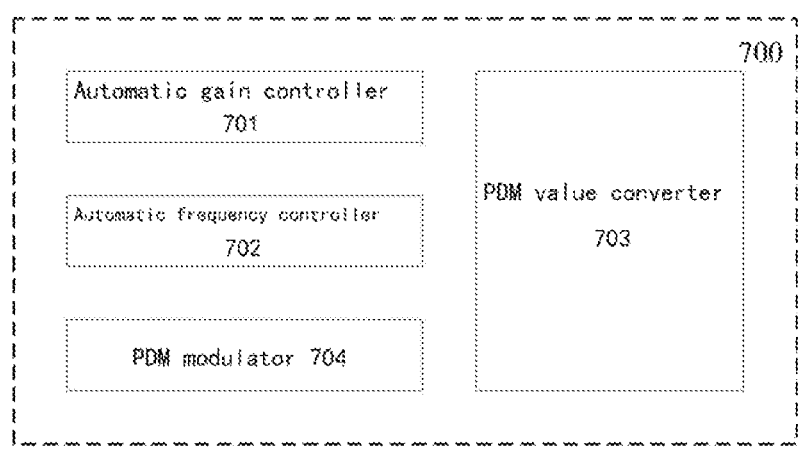
FIG. 7 shows a block diagram of a mobile terminal according to an embodiment of the present invention.

FIG. 7 shows a block diagram of a mobile terminal 700 according to an embodiment of the present invention.

Referring to FIG. 7, a mobile terminal 700 comprises an automatic gain controller 701, an automatic frequency controller 702, a PDM converter 703 and a PDM modulator 704. Wherein, the automatic gain controller 701 may be the automatic gain controller 200 of FIG. 2, the automatic frequency controller 702 may be the automatic frequency controller 300 of FIG. 3, and the PDM converter 703 may be the PDM converter 100 of FIG. 1.

Although the PDM converter 703 and the PDM modulator 704 are shown as separate components, the present invention is not limited in this regard. The PDM converter 703 and/or the PDM modulator 704 may also be implemented as internal components of the automatic gain controller 701 and/or the automatic frequency controller 702 as describe in the above embodiments.

Although the mobile terminal 700 in FIG. 7 comprises an automatic gain controller 701 and an automatic frequency controller 702, the present invention is not limited in this regard. According to an embodiment, the mobile terminal 700 may comprise a PDM converter 703 and any other circuits using a PDM value.

With the PDM value converter, the automatic gain controller using PDM, the automatic frequency controller using PDM and the mobile terminal using PDM, and the method thereof according to the present invention, the accuracy of the PDM value may be increased and the reciprocating ping-pong time in an AGC or AFC process can be reduced by correcting the INL error to improve the linearity of a PDM value, thus improving the performance of power control and tuning control.

Features of many embodiments are described above, so that those of general knowledge in the art can clearly understand the forms of the description clearly. Those of general knowledge in the art can understand that he/she can accomplish the same objectives as the above-mentioned embodiments and/or achieving the same advantages as the above-mentioned embodiments by designing or modifying other processes and structures based on the disclosure of the present invention. Those of general knowledge in the art can also understand that equivalent structures not departing from the spirit and scope of the present invention may be modified, replaced and embellished in any way without departing from the spirit and scope of the present invention, so that those of general knowledge in the art can clearly understand forms of the description. Features of many embodiments are described above, so that those of general knowledge in the art could understand the form of the description clearly. Those of general knowledge in the art can understand that he/she can accomplish the same objectives as the above-mentioned embodiments and/or achieving the same advantages as the above-mentioned embodiments by designing or modifying other processes and structures based on the disclosure of the present. Those of general knowledge in the art can also understand that equivalent structures not departing from the spirit and scope of the present invention may be modified, replaced and embellished in any way without departing from the spirit and scope of the present invention.

The invention claimed is:

1. A pulse density modulation value converter, comprising:
   a pulse density modulation reference point memory to store a plurality of pulse density modulation reference points, each pulse density modulation reference point comprising a linear pulse density modulation value, an actual pulse density modulation value and/or an integral non-linear error value, wherein the integral non-linear error value is the difference between the actual pulse density modulation value and the linear pulse density modulation value; and
   a pulse density modulation value calculator to receive a linear pulse density modulation value, look up a pair of pulse density modulation reference points closest to the linear pulse density modulation value in the pulse density modulation reference point memory, obtain an actual pulse density modulation value corresponding to the linear pulse density modulation value through linear interpolation based on the pair of pulse density modulation reference points, and output the actual pulse density modulation value.

2. The pulse density modulation value converter of claim 1, wherein the pulse density modulation value calculator linearly interpolates the actual pulse density modulation values of the pair of pulse density modulation reference points to obtain an actual pulse density modulation value corresponding to the linear pulse density modulation value.

3. The pulse density modulation value converter of claim 1, wherein the pulse density modulation value calculator linearly interpolates the integral non-linear error values of the pair of pulse density modulation reference points to obtain an integral non-linear error value corresponding to the linear pulse density modulation value, and obtains an actual pulse density modulation value corresponding to the linear pulse density modulation value based on the linear pulse density modulation value and the integral non-linear error value.

4. A mobile terminal, comprising a pulse density modulation value converter of claim 1.

5. A method of pulse density modulation value conversion, comprising:
   receiving a linear pulse density modulation value;
   looking up a pair of pulse density modulation reference points closest to the linear pulse density modulation value among a plurality of pulse density modulation reference points, wherein each pulse density modulation reference point comprises a linear pulse density modulation value, an actual pulse density modulation value and/or an integral non-linear error value, the integral non-linear error value being the difference between the actual pulse density modulation value and the linear pulse density modulation value;
   obtaining an actual pulse density modulation value corresponding to the linear pulse density modulation value through linear interpolation based on the pair of pulse density modulation reference points; and
   outputting the actual pulse density modulation value.

6. The method of claim 5, wherein obtaining an actual pulse density modulation value corresponding to the linear pulse density modulation value through linear interpolation comprises: linearly interpolating the actual pulse density modulation values of the pair of pulse density modulation reference points to obtain an actual pulse density modulation value corresponding to the linear pulse density modulation value.

7. The method of claim 5, wherein obtaining an actual pulse density modulation value corresponding to the linear pulse density modulation value through linear interpolation comprises:
   linearly interpolating the integral non-linear error values of the pair of pulse density modulation reference points to obtain an integral non-linear error value corresponding to the linear pulse density modulation value; and
   obtaining an actual pulse density modulation value corresponding to the linear pulse density modulation value based on the linear pulse density modulation value and the integral non-linear error value.

8. An automatic gain controller, comprising:
   a power reference point memory to store a plurality of power reference points, each power reference point comprising a power value and a linear pulse density modulation value;
   a pulse density modulation value converter to convert a linear pulse density modulation value into an actual pulse density modulation value;
   a power pulse density modulation value calculator to receive a target power value, look up a pair of power reference points closest to the target power value in the power reference point memory, linearly interpolate the linear pulse density modulation values of the pair of power reference points to obtain a linear power pulse density modulation value corresponding to the target power value, and convert the linear power pulse density modulation value into an actual power pulse density modulation value via the pulse density modulation value converter; and
   a pulse density modulator to perform automatic gain control based on the actual power pulse density modulation value.

9. The automatic gain controller of claim 8, wherein the pulse density modulation value converter comprises:

a pulse density modulation reference point memory to store a plurality of pulse density modulation reference points, each pulse density modulation reference point comprising a linear pulse density modulation value, an actual pulse density modulation value and/or an integral non-linear error value, wherein the integral non-linear error value is the difference between the actual pulse density modulation value and the linear pulse density modulation value; and a pulse density modulation value calculator to receive a linear pulse density modulation value, look up a pair of pulse density modulation reference points closest to the linear pulse density modulation value in the pulse density modulation reference point memory, obtain an actual pulse density modulation value corresponding to the linear pulse density modulation value through linear interpolation based on the pair of pulse density modulation reference points, and output the actual pulse density modulation value.

10. The automatic gain controller of claim 9, wherein the pulse density modulation value calculator linearly interpolates the actual pulse density modulation values of the pair of pulse density modulation reference points to obtain an actual pulse density modulation value corresponding to the linear pulse density modulation value.

11. The automatic gain controller of claim 9, wherein the pulse density modulation value calculator linearly interpolates the integral non-linear error values of the pair of pulse density modulation reference points to obtain an integral non-linear error value corresponding to the linear pulse density modulation value, and obtains an actual pulse density modulation value corresponding to the linear pulse density modulation value based on the linear pulse density modulation value and the integral non-linear error value.

12. A mobile terminal, comprising an automatic gain controller of claim 8.

13. A method of automatic gain control, comprising:
receiving a target power value;
looking up a pair of power reference points closest to the target power value among a plurality of power reference points, wherein each power reference point comprises a power value and a linear pulse density modulation value;
linearly interpolating the linear pulse density modulation values of the pair of power reference points to obtain a linear power pulse density modulation value corresponding to the target power value;
converting the linear power pulse density modulation value into an actual power pulse density modulation value; and
performing automatic gain control based on the actual power pulse density modulation value.

14. The method of claim 13, wherein converting the linear power pulse density modulation value into an actual power pulse density modulation value comprises:
looking up a pair of pulse density modulation reference points closest to the linear power pulse density modulation value among a plurality of pulse density modulation reference points, wherein each pulse density modulation reference point comprises a linear pulse density modulation value, an actual pulse density modulation value and/or an integral non-linear error value, the integral non-linear error value being the difference between the actual pulse density modulation value and the linear pulse density modulation value; and
obtaining an actual power pulse density modulation value corresponding to the linear power pulse density modulation value through linear interpolation based on the pair of pulse density modulation reference points.

15. The method of claim 14, wherein obtaining an actual power pulse density modulation value corresponding to the linear power pulse density modulation value through linear interpolation comprises: linearly interpolating the actual pulse density modulation values of the pair of pulse density modulation reference points to obtain an actual power pulse density modulation value corresponding to the linear power pulse density modulation value.

16. The method of claim 14, wherein obtaining an actual power pulse density modulation value corresponding to the linear power pulse density modulation value through linear interpolation comprises:
linearly interpolating the integral non-linear error values of the pair of pulse density modulation reference points to obtain an integral non-linear error value corresponding to the linear power pulse density modulation value; and
obtaining an actual power pulse density modulation value corresponding to the linear power pulse density modulation value based on the linear power pulse density modulation value and the integral non-linear error value.

* * * * *